United States Patent [19]

Tatah

[11] Patent Number: 5,683,601
[45] Date of Patent: Nov. 4, 1997

[54] LASER ABLATION FORWARD METAL DEPOSITION WITH ELECTROSTATIC ASSISTED BONDING

[75] Inventor: Abdelkrim Tatah, Arlington, Mass.

[73] Assignee: Panasonic Technologies, Inc., Cambridge, Mass.

[21] Appl. No.: 643,739

[22] Filed: May 6, 1996

Related U.S. Application Data

[63] Continuation of Ser. No. 328,101, Oct. 24, 1994, abandoned.

[51] Int. Cl.$^6$ .................................................. B23K 26/00
[52] U.S. Cl. ................... 219/121.85; 427/469; 427/555; 427/597; 174/250
[58] Field of Search ........................... 219/121.6, 121.65, 219/121.66, 121.68, 121.69, 121.82, 121.85; 427/466, 469, 552, 554, 555, 556, 596, 597; 174/250; 358/297

[56] References Cited

U.S. PATENT DOCUMENTS

| | | | |
|---|---|---|---|
| 3,560,258 | 2/1971 | Brisbane | 219/121.68 |
| 3,781,978 | 1/1974 | Intrator et al. | 437/171 |
| 4,349,583 | 9/1982 | Kulynych et al. | |
| 4,622,058 | 11/1986 | Leary-Renick et al. | |
| 4,714,628 | 12/1987 | Eloy | 427/523 |
| 4,725,877 | 2/1988 | Brasen et al. | 257/751 |
| 4,734,550 | 3/1988 | Imamura et al. | 219/121.82 |
| 4,752,455 | 6/1988 | Mayer | 219/121.6 |
| 4,758,388 | 7/1988 | Hamada et al. | 219/121.66 |
| 4,895,735 | 1/1990 | Cook | 427/597 |
| 4,933,204 | 6/1990 | Warren, Jr. et al. | |
| 4,987,006 | 1/1991 | Williams et al. | 427/597 |
| 4,987,007 | 1/1991 | Wagal et al. | 427/596 |
| 5,057,184 | 10/1991 | Gupta et al. | |
| 5,079,070 | 1/1992 | Chalco et al. | |
| 5,141,602 | 8/1992 | Chen et al. | |
| 5,153,408 | 10/1992 | Handford et al. | |
| 5,173,441 | 12/1992 | Yu et al. | 219/121.69 |
| 5,175,504 | 12/1992 | Henley | |
| 5,177,594 | 1/1993 | Chance et al. | |
| 5,203,929 | 4/1993 | Takayanagi et al. | 427/597 |
| 5,235,272 | 8/1993 | Henley | |
| 5,246,745 | 9/1993 | Baum et al. | |
| 5,330,968 | 7/1994 | Nagaishi et al. | 427/596 |
| 5,492,861 | 2/1996 | Opower | 427/597 |

*Primary Examiner*—Teresa J. Walberg
*Assistant Examiner*—Gregory L. Mills
*Attorney, Agent, or Firm*—Ratner & Prestia

[57] ABSTRACT

Apparatus and method for metal line deposition on a substrate. Laser ablation of a metal film coated on a first substrate removes metal ions from the film. The ions travel forward to a surface of a second substrate disposed opposite the metal film on the first substrate and are deposited on the second substrate. A positive electrode on the first substrate, a negative electrode on the second substrate, and a power supply create an electric field that is simultaneously applied across the first and second substrates. The positively charged ions in the second substrate migrate toward the negative electrode of the electric field, leaving a surplus of negatively charged ions at the surface of the second substrate. The negative ions in the second substrate electrostatically bond with the positively charged ablated metal ions, thereby assisting the bonding of metal lines to the substrate. The power of the laser used during ablation and the position of a sample stage on which the second substrate is supported may be controlled by a computer to deposit metal line patterns on the second substrate.

9 Claims, 2 Drawing Sheets

LASER ABLATION FORWARD METAL DEPOSITION WITH ELECTROSTATIC ASSISTED BONDING

This application is a continuation of application Ser. No. 08/328,101 filed Oct. 24, 1994 now abandoned.

FIELD OF THE INVENTION

This invention relates to metal line deposition and, more particularly, to laser ablation forward metal line deposition with electrostatic assisted bonding of the metal ions to the substrate.

BACKGROUND OF THE INVENTION

Metal lines are commonly used for connecting circuits in personal computer boards and multichip modules. Existing metal line deposition techniques include laser chemical vapor deposition and laser deposition from metal precursors. These techniques have certain disadvantages associated with them, however. Chemical vapor deposition processes require toxic gases and a vacuum chamber. Deposition from metal precursors requires wet processing that can damage or introduce defects in the surrounding circuitry.

A less expensive and more environmentally friendly metal deposition technique is laser ablation. Laser ablation of metal films in general is a widely known technique wherein a laser beam is focused onto the metal film. The heat and shock wave generated by the laser beam remove, or discharge, particles of the film. Thin films of metals such as copper and gold may be easily removed, or ablated, using green light lasers, such as Q-switched doubled Nd:YAG, Nd:YLF, or copper vapor lasers.

One such laser ablation technique involves the use of pulsed-laser deposition in order to layer complex thin films on substrates. Using this technique, a focused laser beam is directed onto a target film at an angle. The plume of particles that are ablated from the film land on a substrate that is positioned parallel to the target. The particles are thus deposited onto the substrate to form a thin epitaxial coating. Both the substrate and the target are contained in a vacuum environment in this technique. This technique is useful for coating wide surfaces but not localized conductive metal lines.

SUMMARY OF THE INVENTION

The present invention provides apparatus for metal line deposition. A first substrate has a metal coating on its surface, and a laser is used to ablate the metal coating to discharge metal ions. A second substrate, onto which the metal line is to be deposited, is disposed in spaced relation adjacent the surface of the first substrate having the metal coating. An electric field is applied across the first and second substrates to drive the metal ions toward the second substrate and to electrostatically bond the ions to the second substrate.

In another aspect, this invention provides a method of depositing metal lines by disposing a first substrate having a metal coating on its surface in spaced relation to a second substrate such that the second substrate is adjacent the side of the first substrate having the metal coating. The metal coating is ablated to discharge ions of the metal coating. An electric field is applied across the first and second substrates to drive the ions to the second substrate and to electrostatically bond the metal ions to the second substrate.

DETAILED DESCRIPTION OF THE INVENTION

In this invention, laser ablation is used to deposit metal lines on substrates by the ablation of a metal film in a dry process that does not require a vacuum. In combination with the laser ablation, an electric field is applied across the substrate being ablated and the substrate onto which the metal lines are deposited to drive the ablated metal ions toward the deposition location and to electrostatically bond the metal ions to the surface of the deposition substrate.

Figure 1:
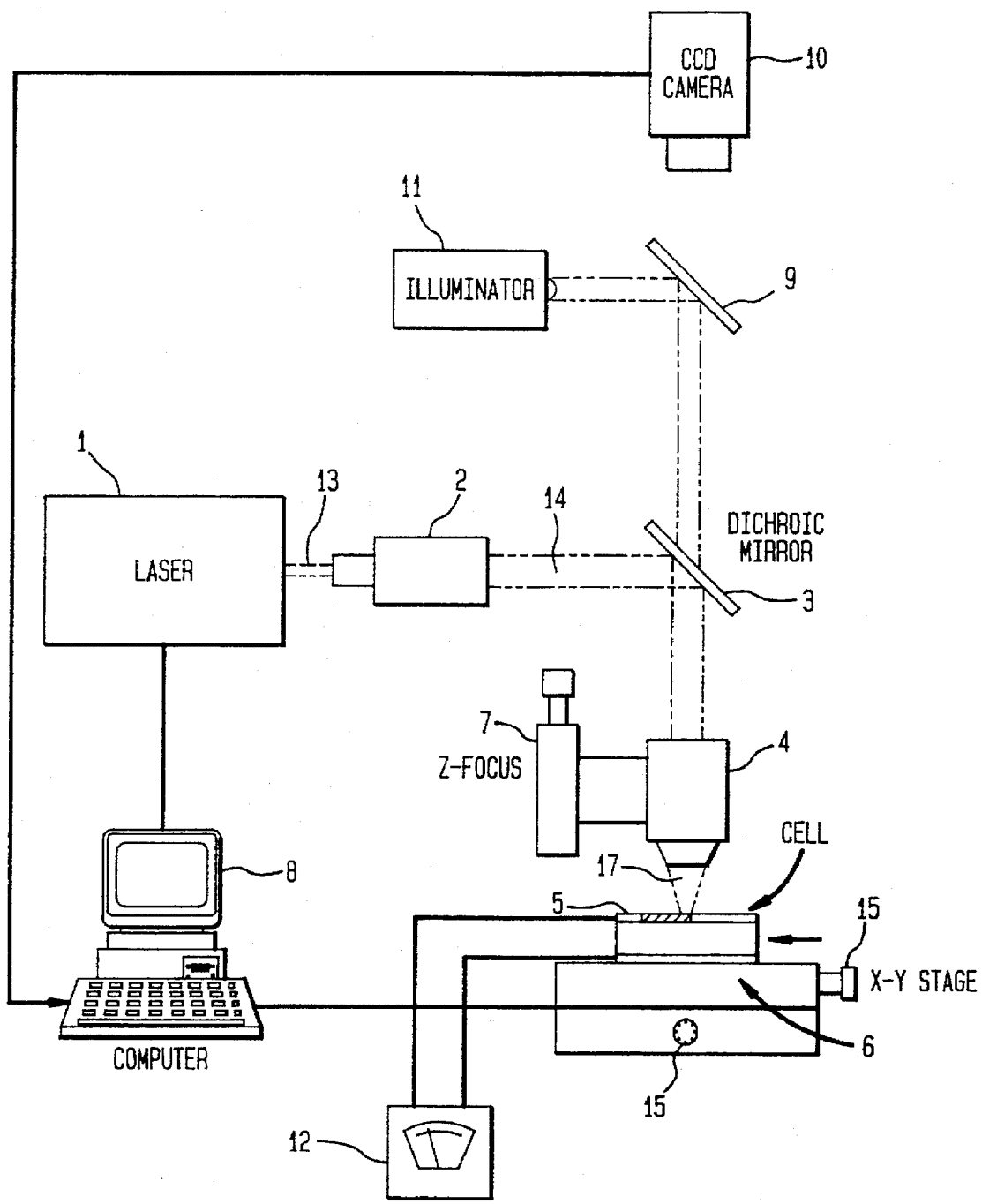
FIG. 1 is a side plan view of laser metal deposition apparatus including an exemplary embodiment of the present invention.

FIG. 1 illustrates a laser metal deposition apparatus including an exemplary embodiment of the present invention. Laser 1 in this exemplary embodiment is a harmonically doubled solid state Q-switched Nd:YLF or Nd:YAG laser, available from Continuum Inc., in Santa Clara, Calif. Laser beam 13 from laser 1 is expanded by telescope 2 into expanded beam 14. Beam 14 shines on dichroic mirror 3 which directs beam 14 into objective lens 4. Objective lens 4 focuses the beam to a diffraction limit spot on sample 5.

In the exemplary embodiment shown in FIG. 1, illuminator 11 provides light that is deflected by mirror 9 onto dichroic mirror 3. Illuminator 11 is used as a white light source to illuminate sample 5 so that the process and location of the focused spot can be monitored. A suitable illuminator is available from Edmund Scientific Company in Barrington, N.J.

Also, in the exemplary embodiment, CCD camera 10 is used to image and monitor the process location. The image is fed to computer 8 which computes subsequent process locations based on a programmed path. Any state of the art video camera is suitable for this purpose.

Sample 5 is supported on stage 6. Stage 6 is equipped with X-Y motion controls 15 that are controlled by computer 8. Suitable motion controls and computer are available from New England Affiliated Technologies in Lawrence, Mass., and comprise, for example, an XY-8080 precision stage, a PCX2 controller, and a 202M microstepping drive, with the controller interfaced to a 486 IBM PC or compatible.

Computer 8 also controls the power of laser 1. By adjusting the position of stage 6 and the power of laser 1, computer 8 enables the deposition of specific patterns on sample 5.

Figure 2:
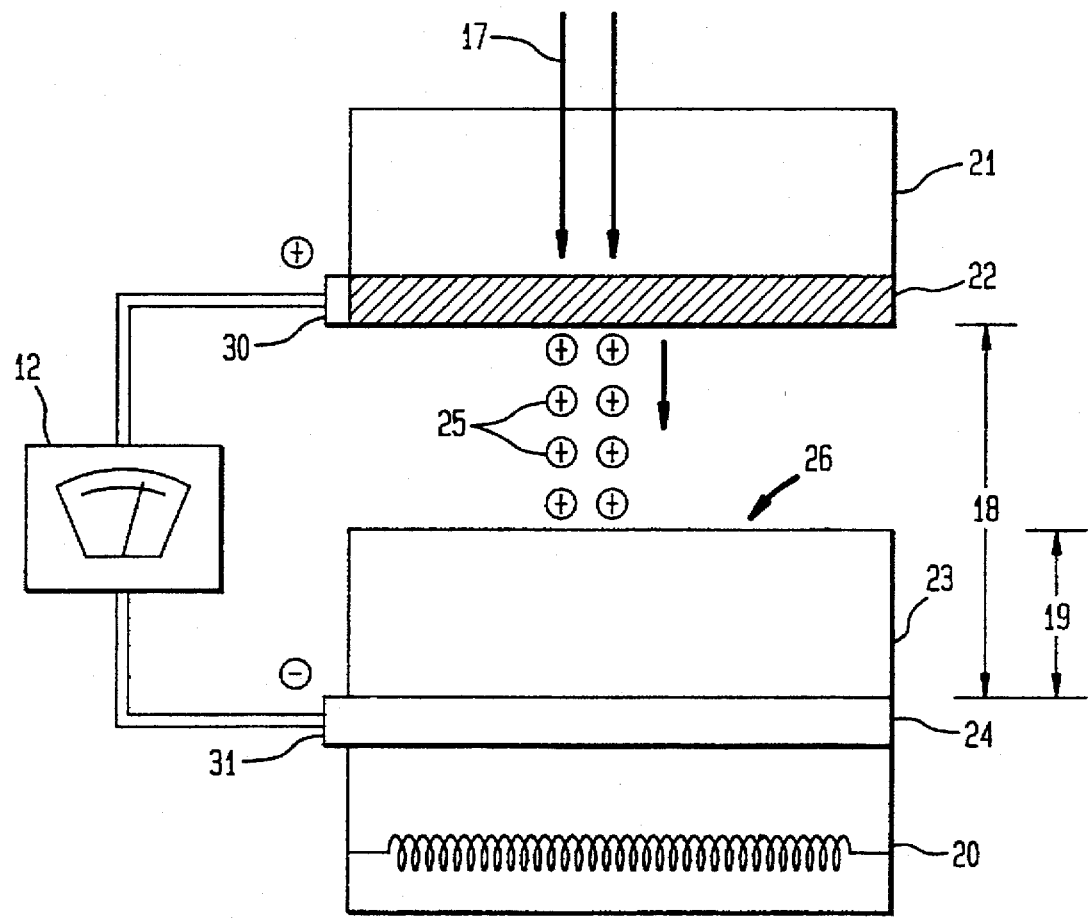
FIG. 2 is a side plan view of an exemplary unit cell for metal deposition and bonding according to the present invention.

Deposition of metal lines onto a substrate is illustrated in FIG. 2. A first substrate 21, which is glass in the exemplary embodiment, is disposed in the path of focused laser beam 17. Glass substrate 21 has metal coating 22 disposed on the side of glass substrate 21 furthest from objective lens 4. Coating 22 may be deposited by standard sputtering deposition or metal plating. Beam 17 passes through glass substrate 21 and impinges on metal coating 22 from the back side; that is, at the surface interface of metal coating 22 and glass substrate 21. The contact of laser 17 with metal coating 22 results in ablation of metal coating 22. During ablation, metal ions 25 accelerate away from metal coating 22.

Second substrate 23, which is also glass in the exemplary embodiment, is disposed adjacent the side of first glass substrate 21 having metal coating 22 thereon. As metal ions 25 accelerate from glass substrate 21 as a result of the ablation caused by focused laser beam 17, metal ions 25 contact second glass substrate 23.

An electric field is applied across first glass substrate 21 and second glass substrate 23 using power supply 12. Power supply 12 is used to create the electric field in this embodiment. Power supply 12 has a positive electrode 30 attached to the initiated metallic line to insure a permanent chemical seal as discussed below. A negative electrode 31 is connected to second glass substrate 23. In the exemplary embodiment of the invention, the voltages applied across the electrodes are at least 300 volts.

The electric field drives positively charged metal ions 25 toward second glass substrate 23. The transfer of metal ions 25 from metal film 22 to surface 26 is due to the electrostatic force and laser ablation-generated acoustic shock waves.

The electric field applied across first glass substrate 21 and second glass substrate 23 also assists the bonding of metal ions 25 to second glass substrate 23. Because of the contact of the negative electrode with second glass substrate 23, the positive ions such as sodium ions in glass substrate 23 migrate away from surface 26 toward the negative electrode. This leaves behind negative ions such as oxygen in the glass substrate 23. These negative ions electrostatically bond with the positive metal ions that contact surface 26. A permanent chemical seal due to a thin metal oxide layer is formed after the electric field is removed. Conducting metal lines can thus be formed on surface 26 of second substrate 23 from metal ions 25.

A hot plate 20 may be used to augment the migration of positive ions within second glass substrate 23 to the negative electrode and thus enhance the bonding of metal ions 25 to surface 26 of second glass substrate 23. The heat increases the diffusion and allows for greater mobility of the ions in the glass.

By adjusting stage controls 15 and the power of laser 1, computer 8 enables movement of stage 6, and hence sample 5, under beam 17. This allows metal line patterns to be written on sample 5. Alternatively, the beam can be moved with a scanner and a scanning lens with the sample held stationary under the beam.

The spacing 18 between the first glass substrate 21 and the second glass substrate 23 may be adjusted to vary the feature size (width) of the resulting metal lines on second substrate 23. As the substrates 21 and 23 are moved further apart to increase spacing 18, the feature size of the lines increases.

The thickness of metal coating 22 may be varied in order to change the thickness of the metal lines on second substrate 23. Having a thicker metal coating 22 on substrate 21 allows more metal ions 25 to be ablated. This produces a thicker metal line.

When used for imaging, such as in the preparation of a lithography mask, laser ablation forward metal deposition with electrostatic assisted bonding according to the present invention may form two metal masks simultaneously. When metal coating 22 is ablated completely, thereby exposing the surface of substrate 21, a mask having a positive image is formed. At the same time, a complementary mask is formed on second substrate 23 having a negative image.

The positive and negative masks formed according to this embodiment of the present invention may be used on the photoresists used in lithography. Both positive and negative photoresists are used. The positive mask may be used on positive photoresist, and the negative mask on the negative photoresist.

Although this invention has been described with reference to a particular embodiment, it is not intended to be limited thereto. Rather, the scope of the invention is intended to be interpreted according to the scope of the appended claims.

What is claimed:

1. A method of metal line deposition using a focused coherent light beam comprising the steps of:
   (a) disposing a first substrate which is transparent to said focused coherent light beam and has a metal coating on a surface thereof in spaced relation to a second substrate such that said second substrate is adjacent the surface of said first substrate having the metal coating;
   (b) ablating said metal coating to form said metal line by directing said focused coherent light beam through said first substrate and onto said metal coating to discharge ions of said metal coating; and
   (c) applying an electric field across said first and second substrates to drive said ions to said second substrate and to electrostatically assist bonding of said ions thereto.

2. A method as claimed in claim 1 that further comprises the steps of:
   (a) disposing said second substrate on a supporting stage;
   (b) moving said supporting stage during said deposition to pattern deposit at least one metal line onto said second substrate.

3. A method as claimed in claim 1 that further comprises the step of varying the spaced relation between said first and second substrates to vary metal line feature size.

4. A method as claimed in claim 1 that further comprises the step of varying metal coating thickness on said first substrate to vary metal line thickness.

5. A method as claimed in claim 1 wherein a first positive image metal mask and a second negative image metal mask are formed simultaneously on said first and second substrates, respectively, during metal deposition.

6. The method of claim 1 further comprising the step of heating said second substrate to enhance bonding of said metal ions to said second substrate.

7. The method according to claim 1, wherein the electric field is applied at about 300 volts.

8. A substrate having at least one metal line formed from ions deposited on said substrate from a transparent substrate base through which a focused laser beam travels to ablate said ions and locally heat said substrate, said ions bonded to said substrate with electrostatic assistance, said substrate produced by the process of:
   (a) providing a focused coherent light beam;
   (b) disposing said substrate base which is transparent to said focused coherent light beam and has a metal coating on a surface thereof in spaced relation to said substrate such that said substrate is adjacent the surface of said substrate base having the metal coating;
   (c) ablating said metal coating to form said metal line by directing said focused coherent light beam through said substrate base and onto said metal coating to discharge ions of said metal coating; and
   (d) applying an electric field across said substrate and said substrate base to drive said ions to said substrate and to electrostatically assist bonding of said ions thereto.

9. The substrate according to claim 8, wherein the electric field is applied at about 300 volts.

* * * * *